United States Patent [19]
Kim

[11] Patent Number: 5,953,603
[45] Date of Patent: Sep. 14, 1999

[54] METHOD FOR MANUFACTURING BICMOS

[75] Inventor: Jae Kap Kim, Ich'on, Rep. of Korea

[73] Assignee: Hyundai Electronics Industries Co., Ltd., Kyoungki-Do, Rep. of Korea

[21] Appl. No.: 09/103,828

[22] Filed: Jun. 24, 1998

[30] Foreign Application Priority Data

Jun. 25, 1997 [KR] Rep. of Korea ............... 97-27408

[51] Int. Cl.⁶ ............................................. H01L 29/76
[52] U.S. Cl. .................... 438/202; 438/203; 438/234; 257/370; 257/372
[58] Field of Search ............................. 438/202, 234, 438/203, 207; 257/370, 372

[56] References Cited

U.S. PATENT DOCUMENTS

| | | | |
|---|---|---|---|
| 4,914,048 | 4/1990 | Scovell et al. | 438/202 |
| 5,081,517 | 1/1992 | Contiero et al. | 257/370 |
| 5,407,840 | 4/1995 | Manoliu et al. | 437/31 |
| 5,504,364 | 4/1996 | Chang et al. | 257/370 |
| 5,776,807 | 7/1998 | Ronkainen et al. | 438/202 |

FOREIGN PATENT DOCUMENTS

| | | |
|---|---|---|
| 0253724 | 1/1988 | European Pat. Off. . |
| 0341821 | 11/1989 | European Pat. Off. . |

*Primary Examiner*—Donald L. Monin, Jr.
*Assistant Examiner*—Mike Dietrich
*Attorney, Agent, or Firm*—Selitto & Associates

[57] ABSTRACT

Disclosed is a method for manufacturing a BiCMOS in which a complementary MOS transistor and a bipolar transistor are formed on the same substrate, comprising the steps of: providing a semiconductor substrate with impurities of a first conductivity type; forming field oxides for device isolation at the substrate to define a first group active region having two active regions and a second group active region having five active regions in series arrangement; forming a first mask pattern to expose three central active regions of the second group active region; forming a buried layer of a second conductivity type at a first depth from surfaces of the three central active regions using the first mask pattern; forming a second mask pattern to expose either one active region of the first group active region and two active regions at both edge portions of the second group active region; forming first well regions of the second conductivity type in which the impurities of the second conductivity type are distributed to a second depth from surfaces of the two exposed active regions of the second group active region using the second mask pattern, wherein the first well regions are overlapped with the buried layer; forming a third mask pattern to expose a remaining active region of the first group active region; and forming a second well in which the impurities of the first conductivity type are distributed at a third depth from a surface of the remaining active region using the third mask pattern.

18 Claims, 5 Drawing Sheets

METHOD FOR MANUFACTURING BICMOS

BACKGROUND OF THE INVENTION

The present invention generally relates to a method for manufacturing a semiconductor device, and more particularly to a method for manufacturing a semiconductor device (hereinbelow referred to as "BiCMOS") which bipolar transistor and complemental metal oxide transistor are formed on the same substrate.

Generally, a small component system interface ("SCCI") chip is being used in controlling compact disc rom driver or hard disc driver of work station computer, and requests high driving current and fast response time.

So as to satisfy such conditions for the SCCI chip, a BiCMOS was provided, in which a complement metal oxide semiconductor ("CMOS") transistor and a bipolar transistor are formed on one semiconductor substrate. The BiCMOS has both advantages. One is a comparatively low electric power consumption which is an advantage of CMOS transistor and the other is a comparatively fast response time which is an advantage of bipolar transistor. As the bipolar transistor for BiCMOS, NPN transistor is mainly used.

Hereinbelow, a conventional method for manufacturing a BiCMOS will be described with reference to the accompanying drawings.

Referring to FIG. 1A, field oxide layer 31 for device isolation is formed at selected portions of a semiconductor substrate 30 with P-typed conductivity by a general local oxidation ("LOCOS") method, and a plurality of active regions displaced between the field oxide layers are defined. Next, so as to prevent damage of the substrate 30 during subsequent ion implantation process, screen oxides 32 are formed on surface of the active regions. In the drawings, a region for the formation of CMOS transistor is referred to as portion "A" and a region for the formation of bipolar transistor is referred to as portion "B". Afterwards, to form collector of bipolar transistor at the portion B, a first mask pattern of photoresist film exposing five active regions, is formed. Thereafter, impurity ions of N-typed conductivity, for example, phosphorous ions are implanted at a given ion implantation energy and at a given dose, thereby to form collector region 34.

Referring to FIG. 1B, after removing the first mask pattern by a widely known plasma ashing process, a second mask pattern 35 is formed. The second mask pattern 35 exposes selected portions of the collector region 34, that is, three active regions bipolar at central portion except both edge active regions. Afterwards, impurity ions of P-typed conductivity, for example, boron ions are implanted into the exposed portion, to thereby form base region 36.

Referring to FIG. 1C, after removing the second mask pattern, a third mask pattern 37 is formed. The third mask pattern 37 exposes either one of two active regions in the portion M. Afterwards, impurity ions of N-typed conductivity, for example, phosphorous ions are implanted into the exposed portion, to thereby form a N-well 38 for PMOS transistor.

Referring to FIG. 1D, after removing the third mask pattern 37, a fourth mask pattern 39 is formed by a conventional photolithography method. The fourth mask pattern 39 exposes a remaining active region of two active regions in the portion B. Afterwards, impurity ions of P-typed conductivity, for example, boron ions are implanted into the exposed portion, to thereby form a P-well 40 for NMOS transistor.

Next, referring to FIG. 1E, after removing the fourth mask pattern 39, the screen oxides 32 are all removed by a widely known method. Thereafter, insulator film such as $SiO_2$ and conductive film such as polysilicon, are deposited on the resultant substrate in that order, and are then patterned to form gate electrodes 42 and the underlying gate insulating layers 41 on surfaces of the two active region of the portion M.

Afterwards, although not shown in the drawings, a fifth mask pattern for exposing the N-well region 38 and two active regions of the base 36 at both edges, is formed. Impurity ions of P-typed conductivity are then implanted into the exposed portion without the fifth mask pattern, to thereby form source and drain regions 43a and 43b for PMOS transistor, and base region 43c.

Thereafter, after removing the fifth mask pattern(not shown), a sixth mask pattern is formed. The sixth mask pattern exposes the P-well region 40, the outermost two active regions of five active regions within the collector region 34, and the central active region of three active regions within the base region 36. Impurity ions of N-typed conductivity, for example, phosphorous ions, are then implanted into the exposed portion without the sixth mask pattern, to thereby form source and drain regions 44a and 44b for NMOS transistor, collector region 44c, and emitter region 44d.

According to the conventional manufacturing method of BiCMOS described above, it needs six times masking steps in forming the BiCMOS because steps for forming the collector region 44c, the base region 43c, and the emitter region 44d are performed independently from each other. Thus, the conventional method is very complicated, so that yield and throughput for the fabrication of BiCMOS are lowered.

SUMMARY OF THE INVENTION

Accordingly, it is an object to provide a method for manufacturing a BiCMOS capable of decreasing the number of process steps by forming collector region and base region using the same mask.

According to one aspect of the present invention, there is provided a method for manufacturing a BiCMOS. The method comprises the steps of: providing a semiconductor substrate with impurities of a first conductivity type of a selected concentration; forming field oxides for device isolation at the semiconductor substrate, to define a first group active region consisting of two active regions and a second group active region consisting of five active regions in series arrangement; forming a first mask pattern to expose three central active regions of said second group active region; implanting impurities of a second conductivity opposite the first conductivity into a first resultant substrate on which the first mask pattern is formed, to form a buried layer at a first depth from surfaces of the three central active regions; forming a second mask pattern to expose either one active region of the first group active region and two active regions at both edge portions of the second group active region; implanting impurities of the second conductivity type into a second resultant substrate on which the second mask pattern is formed, to form first well regions in which the impurities of the second conductivity type are distributed to a second depth from surfaces of the two exposed active regions of the second group active region, wherein the first well regions are overlapped with the buried layer; forming a third mask pattern to expose a remaining active region of the first portion; and implanting impurities of the first conductivity type into a third resultant substrate on which the third mask pattern is formed, to form a second well in which the impurities of the first conductivity type are distributed at a third depth from surface of the remaining active region of the first group active region.

According to another aspect of the present invention, there is provided a method for manufacturing a BiCMOS. The method comprises the steps of: providing a semiconductor substrate with impurities of a first conductivity type of a selected concentration; forming field oxides for device isolation at the semiconductor substrate, to define a first group active region consisting of two active regions and a second group active region consisting of five active regions in series arrangement; forming a first mask pattern to expose three central active regions of said second group active region; implanting impurities of a second conductivity opposite the first conductivity into a first resultant substrate on which the first mask pattern is formed, to form a first buried layer at a first depth from the surfaces of the three central active regions; implanting impurities of the first conductivity into a second resultant substrate in which the first buried layer is formed, to form a second buried layer at a second depth from the surfaces of the three central active regions, said second depth being smaller than said first depth; forming a second mask pattern to expose either one active region to of the first group active region and two active regions disposed at both edge portions of the second group active region; implanting impurities with the second conductivity type into a third resultant substrate on which the second mask pattern is formed, to form first well regions in which the impurities of the second conductivity type are distributed from surfaces of the two exposed active regions of the second group active region to a third depth, wherein the first well regions are overlapped with the first buried layer; forming a third mask pattern to expose a remaining active region of the first group active region; and implanting impurities of the first conductivity type into a fourth resultant substrate on which the third mask pattern is formed, to form a second well in which the impurities of the first conductivity type are distributed from the surface of the remaining active region of the first portion to a fourth depth.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PRESENT INVENTION

Hereinbelow, preferred embodiments of the present invention will be described with reference to the accompanying drawings.

FIGS. 2A to 2D are simplified sectional views for describing a method for manufacturing a BiCMOS according embodiments of the present invention.

Figure 1A:
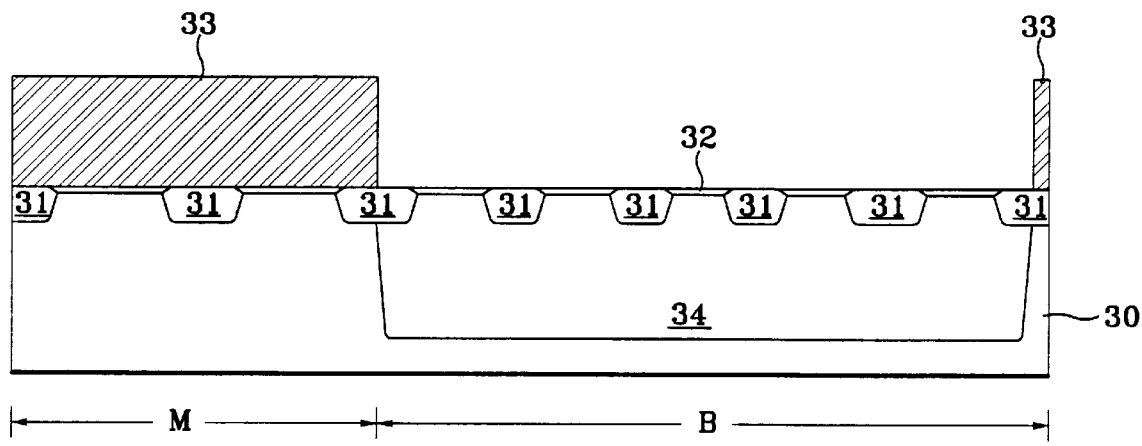
FIGS. 1A to 1E are simplified sectional views for describing a conventional method for manufacturing a BiCMOS.
Figure 1B:
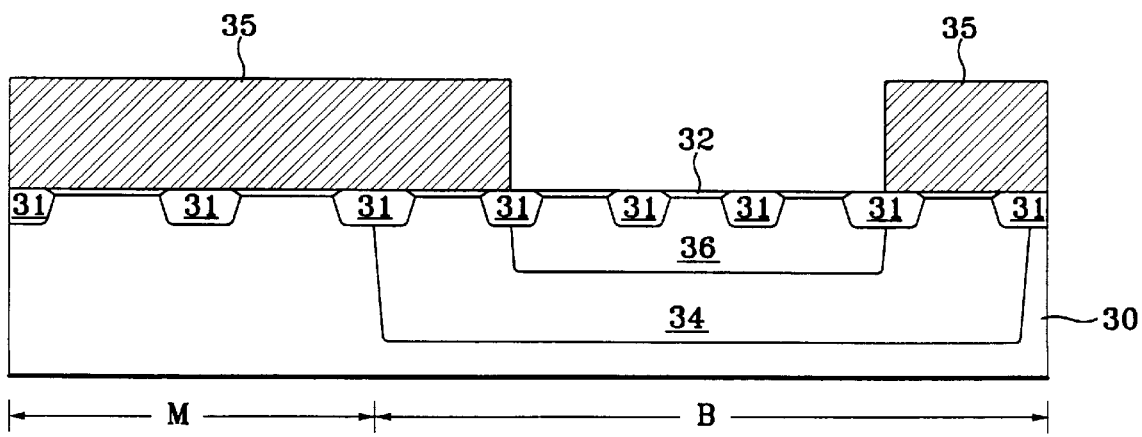
Figure 1C:
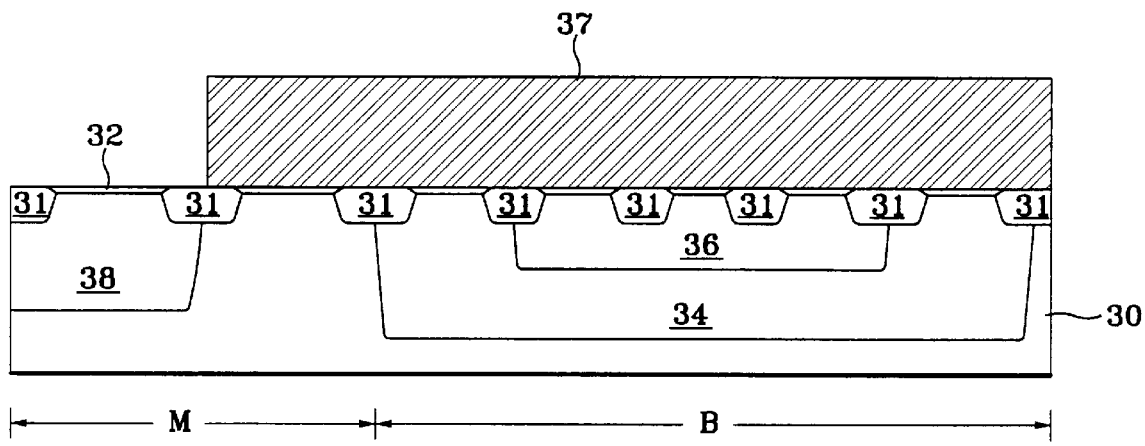
Figure 1D:
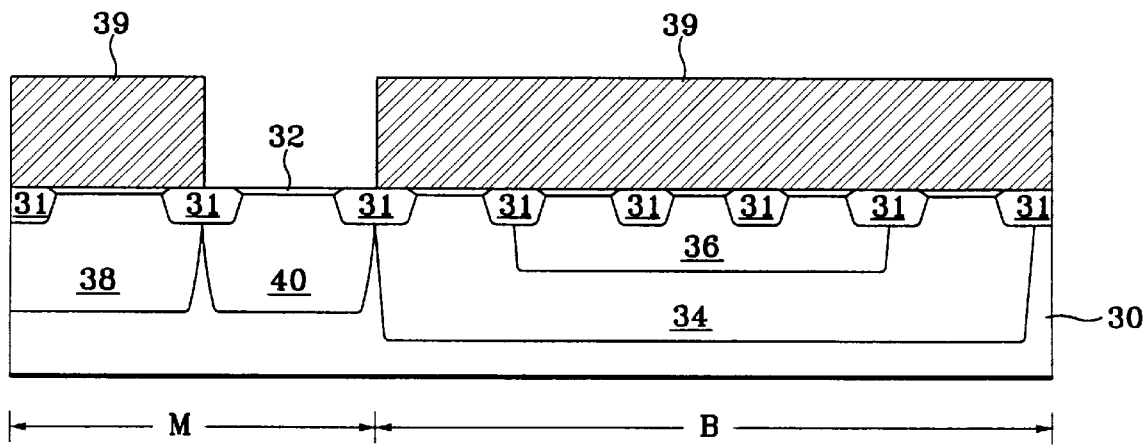
Figure 1E:
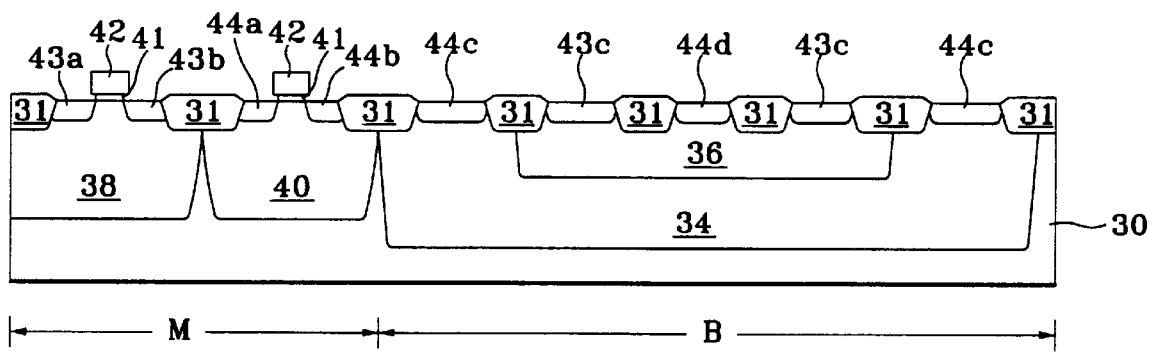
Figure 2A:
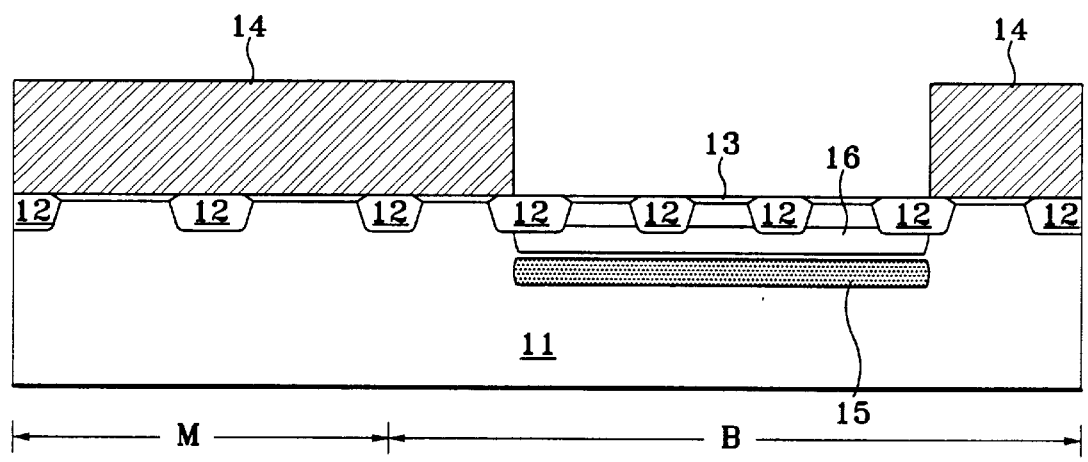
FIGS. 2A to 2D are simplified sectional views for describing a method for manufacturing a BiCMOS according embodiments of the present invention.

Referring to FIG. 2A, a semiconductor substrate of a first conductivity type, for example, a silicon substrate 11 of P-type, is provided. The semiconductor substrate 11 includes a plurality of field oxide layers 12 for device isolation, for instance, eight field oxide layers formed by a conventional local oxidation ("LOCOS") method, and a plurality of active regions, for instance, seven active regions defined by the eight field oxide layers 12. Through the present specification, by the word "active region" is meant a region between two adjacent field oxides and may be meant including a part of the two adjacent oxides. In FIG. 2A, two active regions at left-handed portion is for the formation of a CMOS transistor consisting of NMOS and PMOS transistors, and are referred to as a first group of active region (or sector "M"), while five active regions at right-handed portion is for the formation of a bipolar transistor and is referred to as a second group of active region(or sector "B").

After the field oxide layers 12 is formed, so as to prevent damage of the substrate 11 due to collision of impurity ions during subsequent ion implantation process, screen oxides 13 are formed on surface of each of the active regions. Afterwards, to form a part of collector region of bipolar transistor at the sector B, a first mask pattern 14 of photoresist film exposing three active regions disposed at central portion thereof, is formed. Here, the first mask pattern 14 is formed by a widely known photolithography method to a thickness of about 3 $\mu$M to 5 $\mu$m. Thereafter, impurity ions of a second conductivity type opposite the first conductivity type, for example, phosphorous ions of N-type are implanted at an ion implantation energy of about 1 MeV to 2 MeV and at a dose of $5 \times 10^{12}$ ions/cm$^2$ to $5 \times 10^{13}$ ions/cm$^2$, thereby to form a first buried layer 15 at a first depth from upper surfaces of the exposed active regions without the first mask pattern. Next, using the same first mask pattern 14, impurity ions of the first conductivity type, for example, boron ions of P-type are implanted at an ion implantation energy of about 60 KeV to 200 KeV and at a dose of $5 \times 10^{12}$ ions/cm$^2$ to $5 \times 10^{13}$ ions/cm$^2$, thereby to form a second buried layer 16 at a second depth from upper surfaces of the exposed active regions. Here, the second depth is shallower than the first depth, and therefore the second buried layer 16 is positioned at a place shallower than the first buried layer 15. The first buried layer 15 is a part of collector region for bipolar transistor, and is referred to as a first collector region. While the second buried layer 16 corresponds to a part of base region for bipolar transistor, and is referred to as a first base region. Here, the second buried layer 16 is selectively formed. For example, when the semiconductor substrate 11 has a concentration of $8 \times 10^{15}$ atoms/cm$^2$ to $8 \times 10^{16}$ ions/cm$^2$, the step for forming the second buried layer 16 can be deleted.

Figure 2B:
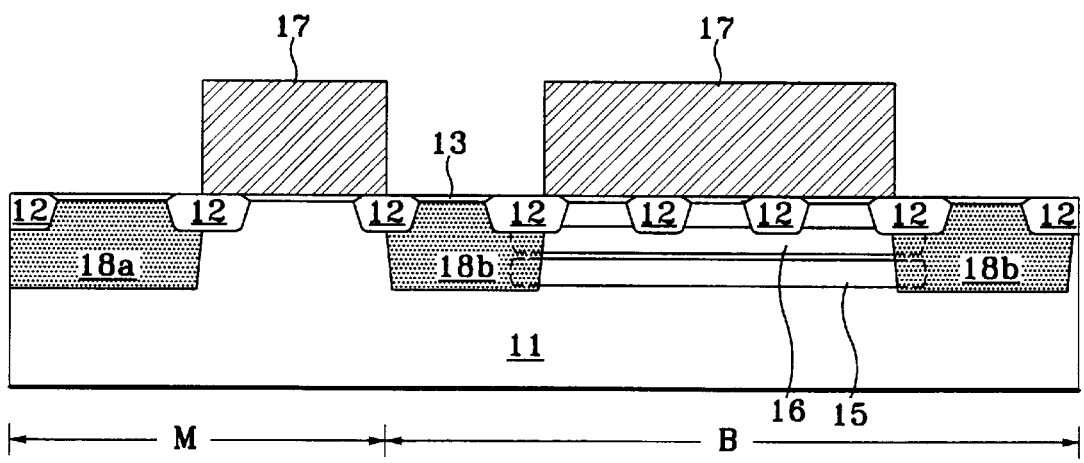

Referring to FIG. 2B, after removing the first mask pattern 14 by a widely known plasma ashing process, a second mask pattern 17 is formed. The second mask pattern 17 simultaneously exposes either one of two active regions in the sector M and the outermost two active regions of the second group of active region. The second mask pattern is also made of photoresist film and has a thickness of about 2 $\mu$m to about 4 $\mu$m. Here, the active region exposed in the sector M corresponds to N-well region for the formation of PMOS, and the two active regions exposed in the sector B correspond to a remaining portion(or second collector region) of collector region for the formation of bipolar transistor. Afterwards, impurity ions of N-type, for example, phosphorous ions are implanted into the exposed portion through three times, to thereby form a N-well 18a for PMOS transistor and the second collector region 18b. At this time, the three times ion implantation step includes the steps of:

first implanting phosphorous ions at an implantation energy of about 1.5 MeV and at a dose of about $5\times10^{12}$ ions/cm$^2$; secondly implanting phosphorous ions at an implantation energy of about 180 KeV to about 250 KeV and at a dose of about $5\times10^{12}$ ions/cm$^2$ to about $2\times10^{13}$ ions/cm$^2$; and thirdly implanting phosphorous ions at an implantation energy of about 30 KeV to about 80 KeV and at a dose of about $2\times10^{12}$/cm$^2$ to about $8\times10^{12}$ ions/cm$^2$. Meanwhile, the second collector region 18b is overlapped with the first collector region (or the first buried region) 15 during subsequent thermal annealing step, to thereby form a collector region for bipolar transistor. Also, it is desirable that the concentration of the N-well 18a is controlled to such a degree that after source and drain regions of PMOS transistor are formed during subsequent process, the PMOS transistor has a threshold voltage of about −0.5 V to −0.8 V.

Figure 2C:
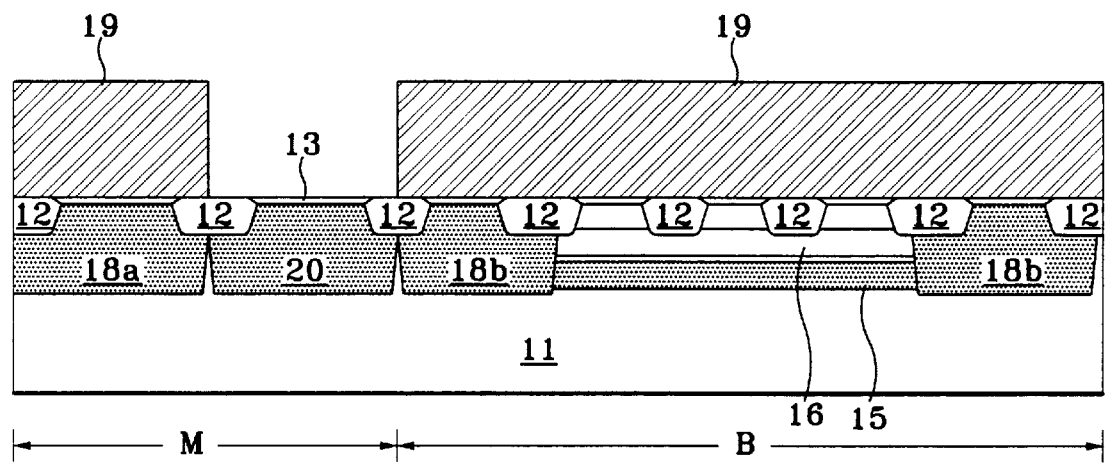

Next, referring to FIG. 2C, after removing the second mask pattern 17 by a conventional method, a third mask pattern 19 is formed by a conventional photolithography method. The third mask pattern 19 exposes a remaining active region, that is, P-well region for the formation of NMOS transistor, of two active regions in the sector M. Here, the third mask pattern is made of photoresist film and has a thickness of about 2 μm to about 4 μm. Afterwards, impurity ions of P-typed conductivity, for example, boron ions are implanted into the exposed portion three times, to thereby form a P-well 20 for NMOS transistor. At this time, the three times ion implantation step includes the steps of: first implanting boron ions at an implantation energy of about 500 KeV to about 700 KeV and at a dose of about $1\times10^{13}$ ions/cm$^2$ to $5\times10^{13}$ ions/cm$^2$; secondly implanting boron ions at an implantation energy of about 70 KeV to about 120 KeV and at a dose of about $5\times10^{12}$ ions/cm$^2$ to about $2\times10^{13}$ ions/cm$^2$; and thirdly implanting boron ions at an implantation energy of about 10 KeV to about 30 KeV and at a dose of about $1\times10^{12}$/cm$^2$ to about $5\times10^{12}$ ions/cm$^2$. Also, it is desirable that the concentration of the P-well 20 is controlled to such a degree that after source and drain regions of NMOS transistor are formed during subsequent process, the NMOS transistor has a threshold voltage of about −0.5 V to −0.8 V.

Figure 2D:
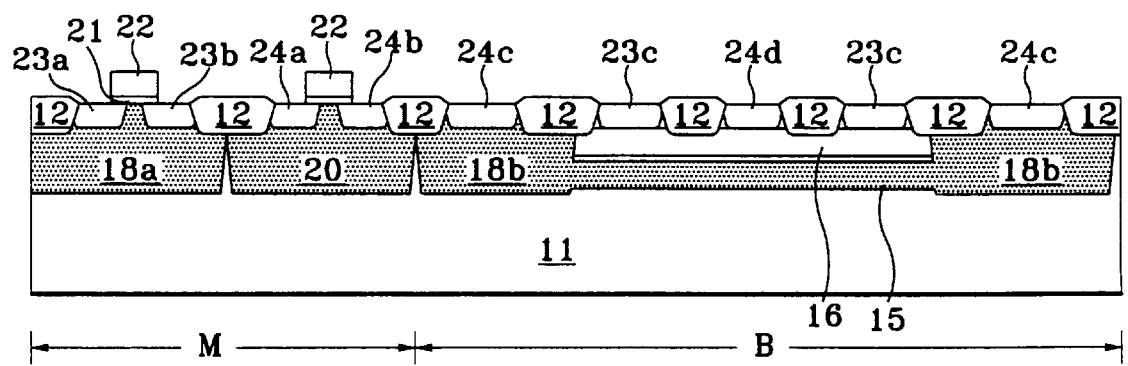

Next, referring to FIG. 2D, after removing the third mask pattern 19, the screen oxides 13 are all removed by a widely known method. Thereafter, insulator film such as SiO$_2$ and conductive film such as polysilicon, are deposited on the resultant substrate in that order, and are then patterned to form gate electrodes 22 and the underlying gate insulating layers 21 on surfaces of the two active region of the sector M.

Afterwards, although not shown in the drawings, a fourth mask pattern for exposing the N-well region 18a and two active regions at both edges in central three active regions of the sector B, is formed. Impurity ions of P-typed conductivity, for example, boron ions are then implanted into the exposed portion without the fourth mask pattern, to thereby form source and drain regions 23a and 23b for PMOS transistor, and a remaining portion 23c (or second base region) of base region for bipolar transistor. Meanwhile, the second base region 23c is overlapped with the first base region (or the second buried region) 16 during subsequent thermal annealing step, to thereby form a full base region for bipolar transistor.

Thereafter, after removing the fourth mask pattern (not shown), a fifth mask pattern is formed. The fifth mask pattern exposes the P-well region 20, the outermost two active regions of five active regions within the sector B, and a central active region of three active regions between the second base regions. Impurity ions of N-typed conductivity, for example, arsenic ("As") ions, are then implanted into the exposed portion without the fifth mask pattern, to thereby form source and drain regions 24a and 24b for NMOS transistor, collector region 24c, and emitter region 24d. Afterwards, after removing the fifth mask pattern, conventional subsequent processes are performed to complete the fabrication of BiCMOS.

Meanwhile, although the N-well region 18a for the formation of PMOS transistor is first formed and the P-well 20 for the formation of NMOS transistor is secondly formed in the present embodiment, the forming order is exchangeable from each other. Regardless of the forming order of P-well and N-well, the same effect is obtained. Further, although the present invention shows and describes use of NPN transistor for bipolar transistor, it is apparent that the method can be easily applied to PNP transistor for bipolar transistor. Furthermore, steps for the formation of the first and second buried layers 15 and 16 may be performed after the step for the formation of P-well region 20 is completed.

As described above, since the present invention does not need an independent mask for the formation of collector region, once masking step for the formation of collector region can be deleted compared with the conventional method. As a result, throughput is increased and fabrication cost is lowered.

Various other modifications will be apparent to and can be made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for manufacturing a BiCMOS in which a complementary MOS transistor and a bipolar transistor are formed on the same substrate, comprising the steps of:

providing a semiconductor substrate with impurities of a first conductivity type of a selected concentration;

forming field oxides for device isolation at the semiconductor substrate, to define a first group active region having two active regions and a second group active region having five active regions in series arrangement;

forming a first mask pattern to expose three central active regions of said second group active region;

implanting impurities of a second conductivity type opposite the first conductivity type into a first resultant substrate on which the first mask pattern is formed, to form a buried layer at a first depth from surfaces of the three central active regions;

forming a second mask pattern to expose either one active region of the first group active region and two active regions at both edge portions of the second group active region;

implanting impurities of the second conductivity type into a second resultant substrate on which the second mask pattern is formed, to form first well regions in which the impurities of the second conductivity type are distributed to a second depth from surfaces of the two exposed active regions of the second group active region, wherein the first well regions are overlapped with the buried layer;

forming a third mask pattern to expose a remaining active region of the first group active region; and implanting impurities of the first conductivity type into a third resultant substrate on which the third mask pattern is formed, to form a second well in which the impurities of the first conductivity type are distributed at a third depth from a surface of the remaining active region of the first group active region.

2. The method in claim 1, wherein the first conductivity type is P-type and the second conductivity type is N-type.

3. The method in claim 1, wherein the first conductivity type is N-type and the second conductivity type is P-type.

4. The method in claim 1, wherein said semiconductor substrate of the semiconductor substrate providing step has a concentration range of $8\times10^{15}$ atoms/cm$^2$ to $8\times10^{16}$ atoms/cm$^2$.

5. The method in claim 1, wherein the buried layer is formed by implanting phosphorous ions at an ion implantation energy of about 1 MeV to about 2 MeV and at a dose of about $5\times10^{12}$ ions/cm$^2$ to about $5\times10^{13}$ ions/cm$^2$.

6. The method in claim 1, wherein the first mask pattern is formed to a thickness range of 3 $\mu$m to 5 $\mu$m.

7. The method in claim 1, wherein the second mask pattern is formed to a thickness range of 2 $\mu$m to 4 $\mu$m.

8. The method in claim 1, wherein the first well forming step comprises the steps of: first implanting phosphorous ions at an implantation energy of about 1.5 MeV and at a dose of about $5\times10^{12}$ ions/cm$^2$; secondly implanting phosphorous ions at an implantation energy of about 180 KeV to about 250 KeV and at a dose of about $5\times10^{12}$ ions/cm$^2$ to about $2\times10^{13}$ ions/cm$^2$; and thirdly implanting phosphorous ions at an implantation energy of about 30 KeV to about 80 KeV and at a dose of about $2\times10^{12}$/cm$^2$ to about $8\times10^{12}$ ions/cm$^2$.

9. The method in claim 1, wherein the second well forming step comprises the steps of: first implanting boron ions at an implantation energy of about 500 KeV to 700 KeV and at a dose of about $1\times10^{13}$ ions/cm$^2$ to about $5\times10^{13}$ ions/cm$^2$; secondly implanting boron ions at an implantation energy of about 70 KeV to about 120 KeV and at a dose of about $5\times10^{12}$ ions/cm$^2$ to about $2\times10^{13}$ ions/cm$^2$; and thirdly implanting boron ions at an implantation energy of about 10 KeV to about 30 KeV and at a dose of about $1\times10^{12}$/cm$^2$ to about $5\times10^{12}$ ions/cm$^2$.

10. The method in claim 1, further comprising a step of forming a screen oxide to a selected thickness on all of the active regions prior to said impurity-implanting step for forming the buried layer.

11. A method for manufacturing a BiCMOS in which a complementary MOS transistor and a bipolar transistor are formed on the same substrate, comprising the steps of:

providing a semiconductor substrate with impurities of a first conductivity type of a selected concentration;

forming field oxides for device isolation at the semiconductor substrate, to define a first group active region having two active regions and a second group active region having five active regions in series arrangement;

forming a first mask pattern to expose three central active regions of said second group active region;

implanting impurities of a second conductivity type opposite the first conductivity type into a first resultant substrate on which the first mask pattern is formed, to form a first buried layer at a first depth from surfaces of the three central active regions;

implanting impurities of the first conductivity type into a second resultant substrate in which the first buried layer is formed, to form a second buried layer at a second depth from the surfaces of the three central active regions, said second depth being smaller than said first depth;

forming a second mask pattern to expose either one active region of the first group active region and two active regions disposed at both edge portions of the second group active region;

implanting impurities with the second conductivity type into a third resultant substrate on which the second mask pattern is formed, to form first well regions in which the impurities of the second conductivity type are distributed from surfaces of the two exposed active regions of the second group active region to a third depth, wherein the first well regions are overlapped with the first buried layer;

forming a third mask pattern to expose a remaining active region of the first group active region; and implanting impurities of the first conductivity type into a fourth resultant substrate on which the third mask pattern is formed, to form a second well in which the impurities of the first conductivity type are distributed from surface of the remaining active region of the first group active region to a fourth depth.

12. The method in claim 11, wherein the first conductivity type is P-type and the second conductivity type is N-type.

13. The method in claim 11, wherein the first conductivity type is N-type and the second conductivity type is P-type.

14. The method in claim 11, wherein the first buried layer is formed by implanting phosphorous ions at an implantation energy of about 1 MeV to about 2 MeV and a dose of about $5\times10^{12}$ ions/cm$^2$ to about $5\times10^{13}$ ions/cm$^2$.

15. The method in claim 11, wherein the second buried layer is formed by implanting boron ions at an implantation energy of about 60 KeV to about 200 KeV and a dose of about $5\times10^{12}$ ions/cm$^2$ to about $5\times10^{13}$ ions/cm$^2$.

16. The method in claim 11, the first well forming step comprises the steps of: first implanting phosphorous ions at an implantation energy of about 700 KeV to about 1.5 MeV and at a dose of about $5\times10^{12}$ ions/cm$^2$ to about $5\times10^{13}$ ions/cm$^2$; secondly implanting phosphorous ions at an implantation energy of about 180 KeV to about 250 KeV and at a dose of about $5\times10^{12}$ ions/cm$^2$ to about $2\times10^{13}$ ions/cm$^2$; and thirdly implanting phosphorous ions at an implantation energy of about 30 KeV to about 80 KeV and at a dose of about $2\times10^{12}$/cm$^2$ to about $8\times10^{12}$ ions/cm$^2$.

17. The method in claim 11, wherein the second well forming step comprises the steps of: first implanting boron ions at an implantation energy of about 500 KeV to 700 KeV and at a dose of about $1\times10^{13}$ ions/cm$^2$ to about $5\times10^{13}$ ions/cm$^2$; secondly implanting boron ions at an implantation energy of about 70 KeV to about 120 KeV and at a dose of about $5\times10^{12}$ ions/cm$^2$ to about $2\times10^{13}$ ions/cm$^2$; and thirdly implanting boron ions at an implantation energy of about 10 KeV to about 30 KeV and at a dose of about $1\times10^{2}$/cm$^2$ to about $5\times10^{12}$ ions/cm$^2$.

18. The method in claim 11, further comprising a step of forming a screen oxide to a selected thickness on all of the active regions prior to said impurity-implanting step for forming the first buried layer.

* * * * *

UNITED STATES PATENT AND TRADEMARK OFFICE
CERTIFICATE OF CORRECTION

PATENT NO.    : 5,953,603
DATED         : September 14, 1999
INVENTOR(S)   : Jae Kap Kim It is certified that error appears in the above-identified patent and that said Letters Patent is hereby corrected as shown below:

<u>Column 3,</u>
Line 26, delete "to".

<u>Column 8,</u>
Line 24, insert -- "a" -- after "from" and before "surface".

Signed and Sealed this

Twenty-eighth Day of October, 2003

JAMES E. ROGAN
*Director of the United States Patent and Trademark Office*